United States Patent [19]

Wested

[11] 4,377,722
[45] Mar. 22, 1983

[54] SOLAR CELL UNIT AND A PANEL OR BATTERY COMPOSED OF A PLURALITY OF SUCH SOLAR CELL UNITS

[75] Inventor: Jens Wested, Herlev, Denmark

[73] Assignee: Elektronikcentralen, Horsholm, Denmark

[21] Appl. No.: 234,199

[22] Filed: Feb. 13, 1981

[30] Foreign Application Priority Data

Feb. 25, 1980 [DK] Denmark ............................. 797/80

[51] Int. Cl.³ ............................................. H01L 31/04
[52] U.S. Cl. ................................... 136/244; 136/255; 136/256; 136/259
[58] Field of Search ............... 136/244, 255, 256, 259; 357/30

[56] References Cited

U.S. PATENT DOCUMENTS

| 2,320,185 | 5/1943 | Lamb | 136/256 |
| 3,310,439 | 3/1967 | Seney | 136/259 |
| 3,475,609 | 10/1969 | Schneider | 250/199 |

Primary Examiner—Aaron Weisstuch
Attorney, Agent, or Firm—LeBlanc, Nolan, Shur & Nies

[57] ABSTRACT

The effective area of a solar cell unit may be enlarged or increased considerably relative to its physical area by providing its exposed surface layer with a periodic structure or pattern, by which a local field is generated, a so-called Hartree harmonics field. The periodic structure is preferably a grating structure or pattern, and by orienting the solar cell edgewise so that the sunlight is grazing rather than oblique or directly perpendicular to the surface, its response factor may be increased up to a factor 11 theoretically.

23 Claims, 15 Drawing Figures

SOLAR CELL UNIT AND A PANEL OR BATTERY COMPOSED OF A PLURALITY OF SUCH SOLAR CELL UNITS

This invention relates to solar cell units, methods of making such units and a panel or battery composed of a plurality of such solar cell units.

The effective area of prior art solar cell units can never exceed their physical area. Normally, their coefficient of utilization is between 11 and 18 percent; Further, the illumination of a surface of e.g., a solar cell unit obeys the cosine law of illumination. This law contributes to a reduction of the effective area by a factor $2/\pi$ in the case that the illumination is by diffuse light with constant intensity in all directions. In case of light directly from the sun the effect of the cosine law can be avoided by providing the solar cell unit with a clockwork driven moving mechanism which is arranged to always let the normal of the illuminated surface of a particular solar cell unit point at the sun. Such a mechanism, however, is rather expensive and bulky too, and further, the cosine law still applies, which is of importance in cases where the sunlight is not influxed directly but is scattered from a cloudy sky.

It is an object of the present invention to provide a solar cell unit the effective area of which is larger than its physical area and by means of which the adverse effects of said cosine law can be avoided without the employment of moving mechanisms.

The abovementioned objects are achieved by means of a semiconductor solar-cell unit including a substrate or base of a first conductivity-type (p-type or n-type) material, the substrate or base being overlaid with a surface layer of a second conductivity-type (n-type or p-type, respectively) material; said surface layer being adapted for exposure to receive incident electromagnetic or solar radiation, wherein said surface layer is provided with a periodic structure forming or appearing as a pattern, e.g. a grating structure, which define alternating regions or zones having different complex impedances with respect to an incident substantially plane electromagnetic wave, and wherein the periodicity of the structure is so designed or dimensioned with regard to said complex impedances such that generation of a local field of standing waves, a so-called Hartree-harmonics field, is permitted, whereby said local field may interfere with tangentially influxed electromagnetic waves to deflect said influxed waves towards said surface layer and thus enlarge the effective area of the solar cell unit.

The existence of a field of Hartree-harmonics is very well known within the theory of electromagnetic fields and is for instance known from the designing of dielectric antennas having a periodic structure. Under proper conditions there is generated local oscillations in the periodic structure, the field of which is called the Hartree-harmonics field. Optical periodic structures are also well known, cf. for example an article of William S. C. Chang entitled: "Periodic Structures and Their Application in Integrated Optics" and disclosed in the periodical: *IEEE Transactions on Microwave Theory and Techniques*, vol. MTT-21, No. 12, December 1973, p.p. 775-785.

The Hartree-harmonics field has the effect that substantially tangentially incident light is deflected towards the structured surface of the solar cell unit resulting in that the effective area orthogonal to the tangential direction of incidence may be larger than the physical area of said solar cell unit. Further, as deviations from the tangential direction of the direction of incidence of the light only have a minor influence on the deflection of rays towards the exposed surface, also an increased part of diffuse light will be deflected.

The statement above that the complex impedance alternates means that the impedance of one region or zone may have a finite value whereas the impedance of an adjacent or contiguous region or zone then has an infinite value or vice versa. Further, it should be noted that the complex impedances vary as the frequency, which also applies to the periodicity of the structure. In this context an infinite complex impedance means a total reflection whereas a finite impedance implies an absorption of energy which is responsible for the generation of a local field, provided the proper conditions are present. The structure may have many parameters, among which two can be influenced during the elaboration of the structure pattern in the solar cell unit of the present invention, viz., that which alternates and the length of the periodicity. The reflection of light may alternate either because of an alternation of the surface level, i.e., the presence of alternating ribs and grooves in the surface, or because of an alternating index of refraction or, which in this case is the same, an alternating dielectric constant. It is irrelevant to the efficiency if the color changes as the color of a layer or substrate, the thickness of which is of the same order of magnitude as the wavelength of the light, varies in dependance on the direction from which the surface is observed and is therefore not a function of the structure.

The present invention has by a matter of choice been expressed in terms of complex impedances alternating throughout a "structured" surface layer, the structure being periodic and of a geometric or physical nature. Thus, the complex impedance of the surface alternates and has a periodicity approximately equal to a quarter of a wavelength of the incident light.

The dimensioning of the grating periodicity will partly depend on the bandwidth of the incident light, but additionally, it will have to be determined in dependance on the photoelectric elaboration of the solar cell which determine its sensitivity to the frequency of the incident light. If the spectral sensitivity of the solar cell reaches beyond the one octave which the human eye can perceive as visible light, then, either the distance from the top of a rib to the bottom of a groove, i.e., the groove-depth, or the distance from a front wall of a rib to the front wall of a succeeding rib, or both, should be varied so that the light deflecting effect of the Hartree-harmonics field becomes sufficiently broad-banded. Accordingly, the term "light" should in the present context be understood as covering all the solar radiation which the photoelectric elaboration of the employed solar cell permits to be utilized, possibly also including ultra-violet as well as infrared radiation. This means that the grating periodicity may vary across the surface of the solar cell or that the groove-depth may vary in order to increase the bandwidth.

The appearance of the pattern may vary a great deal. It may exhibit parallel lines and hence be similar to an optical grating or a plurality of such gratings having mutually different grating constants; they, however, distinguish themselves from optical gratings in that the effect of an optical grating is solely due to the line structure of the grating, whereas, in the surface of the solar cell unit, also the design of the individual lines, e.g., the groove-depth, is of importance. The pattern may instead of straight lines exhibit wavy lines, or the surface may alternatively exhibit a double-periodic or multi-periodic structure obtained for instance by providing pattern-free areas within a pattern of its own. The pattern may instead of wavy lines exhibit circular, semi-circular or quarter-circular lines, or, in order to achieve sensitivity to TM-modes as well as TE-modes, which are the oscillation modes of the light contained in the incoherent solar radiation, the pattern may appear like a chessboard or consist of isolated spots instead of the contiguous squares of a chessboard or, alternatively, the pattern may exhibit mutually orthogonal, dashed lines appearing as arrays of plus signs.

The invention is further related to various methods of making solar cells according to the invention. The reproduction of patterns may be carried out by means of a holographic method, possibly employing laser beams and preferably by letting the pattern on the solar cell be the holographic negative picture of a suitable "object", which as a holographic negative picture exhibits the desired microscopic line-pattern. Thus, changing the wavelength of the coherent light may be utilized in altering the dimensions of the pattern. Further, any method within the semiconductor technology known hitherto may be employed.

Special attention should be paid to the fact that in the manufacture of microcircuits it is normally required that faults such as bridgings between neighboring lines or conductors or interruptions of a conductor line under any circumstances should be prevented, as bridgings or interruptions of this kind would cause a damaging short circuit or interruption, whereas faults of this kind or indefinitenesses of line widths or of line spaces to a considerable amount is acceptable in carrying out the invention, because the efficiency of the pattern will not be adversely affected as long as the total area of the faults is small compared to the entire area of the pattern.

This invention also comprises an embodiment, in which the pattern is not provided in the surface itself of the semiconductor substrate but in the surface of a translucent layer deposited on said substrate or in the surface of a translucent film or lamina positioned just in front of said substrate. A film or lamina of this kind may be employed either with the purpose of covering or protecting the solar cell unit or with the motivation that it could be easier to provide such a protective layer with the desired pattern.

This invention further relates to a set-up of an array or a battery of solar cell units in such manner that the available light is utilized in the best possible way, viz., in such a manner that the solar cells forming said battery are positioned such that their light sensitive surfaces are substantially parallel with the average position of an ecliptic plane.

In the following the invention will be further described with reference to the accompanying drawings, in which.

Figure 1:
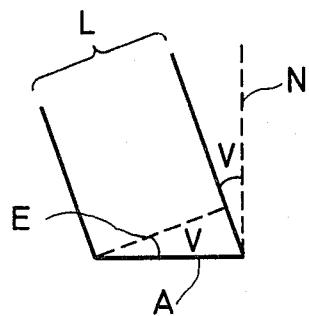
FIG. 1 is a sketch illustrating the common cosine law applicable to prior art solar cells.

In FIG. 1 the light sensitive surface of a prior art solar cell unit is designated by the letter A. A line orthogonal to this surface, its normal, is designated by the letter N. An incident bundle of light beams, the direction of which forms an angle V to the normal N, is designated by the letter L and its effective area by the letter E. The cosine law is evident from the right-angled triangle which has the solar cell surface A as hypoteneuse, so that the equation $E = A \cos V$ applies. It then appears that if an ordinary solar cell should be capable of exhibiting an effective area relative to directly incident sunlight which is equal to its physical area, then it would be necessary to manipulate the solar cell unit, for instance by means of a clockwork mechanism, in such a way that its normal is kept permanently parallel with the direction of incidence of light. It is further evident that with a cloudy sky and an inherent scattered influx of light, all the light coming from all other directions than that which is parallel with the normal of the surface will be reduced in accordance with the cosine law mentioned above.

Figure 2:
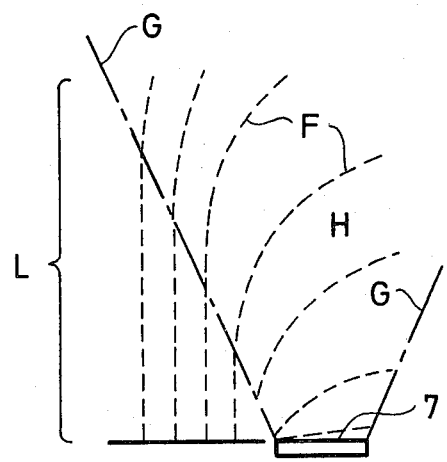
FIG. 2 is a sketch illustrating phase fronts for light through a Hartree-harmonics field external of a solar cell unit of the invention.
Figure 3:
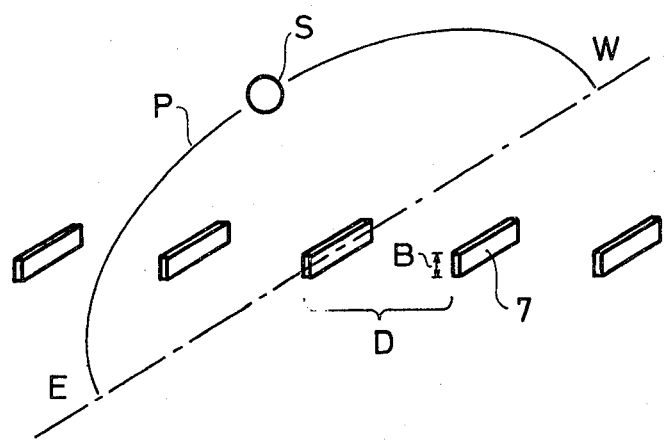
FIG. 3 is a perspective view of a battery comprising a plurality of solar cell units of the invention.

Reference is now made to FIG. 2. When a bundle L of light beams passes across (is grazing) a surface of a solar cell of the invention, then there will be generated in the space above said surface a field H of Hartree-harmonics within the oblique lines G which start from the edges of the pattern. Even if the field of Hartree-harmonics is shown as having sharp limits it will be understood that the field intensity is gradually decreasing outwardly. A grazing bundle of light L has parallel phase fronts external of the frontal boundary line G of the Hartree-field but past this line within the Hartree-field the phase fronts F are curved towards the pattern on the surface of the solar cell unit. Calculations have proved that the effective or influencing area of the bundle L of light may attain a value five times larger than the physical area of the patterned surface 7, provided only one oscillation mode of the light, e.g., the TM-mode, is present, and ten times larger if the TM-mode as well as the TE-mode is utilized. Additionally, scattered light, which in this connection means light, the direction of incidence of which forms an angle to the bundle of light shown, will also be deflected towards the pattern so that a weakening of this light according to the cosine law will not be noticeable. In contrast to ordinary solar cell batteries which have to face the sun, a solar cell panel or battery comprising a plurality of solar cells according to the invention has to be set up so that an edge is facing the source of light, as illustrated in FIG. 3. The spacing D between the individual solar cells in the battery may be ten times the width B of a solar cell. A battery of this kind may preferably be set up so that the surfaces 7 of the solar cells are parallel to the ecliptic plane E—W as shown in FIG. 3 by a semiellipse through the sun S.

Figure 4:
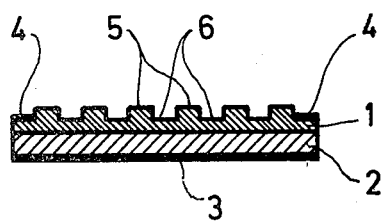
FIGS. 4 to 7 are sectional views of various embodiments of solar cell units of the present invention.

Referring to FIG. 4, there is illustrated a section of an embodiment of a solar cell of the present invention. It comprises two contiguous layers 1 and 2, respectively, with different or opposite conductivities (n-type versus p-type semiconductors). The underside surface of the bottom layer 2 is provided with an electrode 3, whereas the upper surface of the top layer 1 is provided with an electrode 4 which is shaped like a frame and attached to said surface. Within the frame and in the surface of the top layer 1 there is provided a pattern which in the section illustrated appear as an array of protrusions 5 with interposed grooves 6. The grooves may be provided by means of an etching technique. An adequate length of the grating periodicity may be of the order of magnitude of from one to two tenths of a micrometer which will result in the generation of a Hartree-harmonics field across the structure and render it effective through the entire spectrum of visible light covering wavelengths from 0.4 to 0.8 micrometers. The pattern will be rather insensitive to variations of the width of the ribs and to other faults, for instance bridgings between adjoining grooves or like interruptions of the lines, due to the fact that the desired destinction or degree of fineness for the pattern is approaching the limits of what it is possible to provide faultless by means of today's VLSI-techniques.

Figure 5:
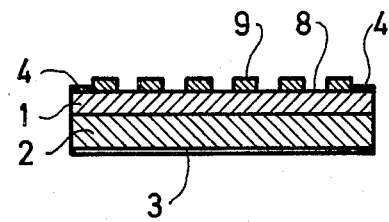

Referring to FIG. 5, there is shown another embodiment of a solar cell unit according to the invention, in which the top layer 1 has a planar surface 8 onto which is attached the frame-like electrode 4 and rib-like protrusions 9 by means of well known deposition-techniques.

Figure 6:
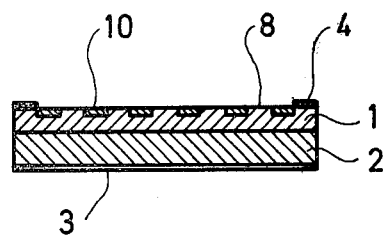

In FIG. 6 another embodiment of a solar cell unit is shown in which the top layer 1 has a planar or smooth surface 8. The pattern is provided by embedding lines 10 of different indices of refraction or dielectric constants in the surface, for instance by means of ion implantation or by guiding a gas across etched grooves in a photoresist so that gas molecules diffuse through the surface for dissolution in a solid.

Figure 7:
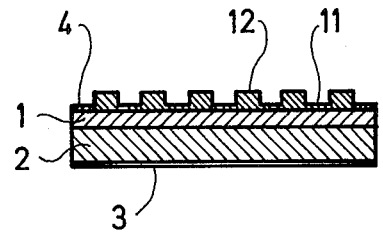

An embodiment of a solar cell unit of the invention shown in FIG. 7 distinguishes itself from those shown previously in that the upper surface of the top layer 1 has been coated with a film provided with grooves 11 between protrusions 12. This film may consist in a vaporized layer of glass or a similar translucent material which protects the solar cell unit against external influences on the one hand, and which on the other hand is easier to provide with the necessary pattern than the surface of the solar cell unit itself. Alternatively, the film may consist of a lamina separated from the top layer 1, which lamina is provided with the pattern before it is placed in front of said layer 1.

The outlook or appearance of the pattern may be varied within wide limits as exemplified roughly in FIGS. 8-15. According to FIG. 8, the pattern is composed by equidistant straight lines. The pattern is simple and may be utilized without hesitation, as grazing light the direction of incidence of which is not perpendicular to the lines but is oblique, will be deflected towards the normal of the lines in the tangential plane.

Figure 9:
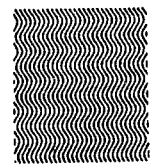

The pattern shown in FIG. 9 exhibits similar stripes, with the exception of being wavy. This has two effects. Firstly, the field of Hartree-harmonics will become more broad-banded, because the length of the grating periodicity for a given direction of influx varies across the surface; secondly, the requirements of orthogonal influx will be lessened.

Figure 10:

The pattern shown in FIG. 10 comprises semicircles for the same reasons as given for the pattern of FIG. 9.

Figure 8:
FIGS. 8 to 15 are examples of various patterns with which the surface of a solar cell unit according to the present invention may be provided.
Figure 11:
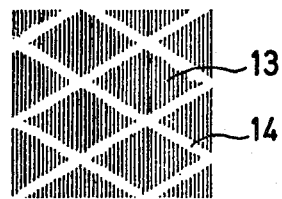
Figure 12:
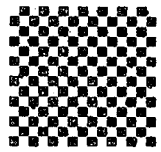

The pattern shown in FIG. 11 has a double periodicity provided by dividing the straight lines of FIG. 8 and gathering them into groups in the shape of small islands 13 with intermediate pattern-free areas 14.

The light from the sun is incoherent. This has the effect that the patterns shown in FIGS. 8-11 will be effective only on the TM-mode of the light and not on the TE-mode. This loss of the half energy-band of the light may be prevented by employing patterns as those illustrated in FIGS. 12-15. The pattern in FIG. 12 exhibits lines which are interrupted to form a chessboard-like pattern. It is not necessary for the black squares to be contiguous.

Figure 13:
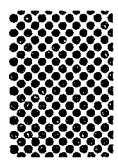
Figure 14:
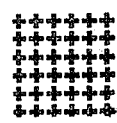
Figure 15:
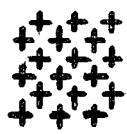

The same effect is obtained by changing the black squares of the chessboard into mutually separated spots as illustrated in FIG. 13, or by providing mutually orthogonal dashed lines as illustrated in FIG. 14, thus providing arrays of plus signs. An alternative form of the last mentioned pattern is shown in FIG. 15, where the plus signs in every second line are off-set a half sign-step.

I claim:

1. A semiconductor solar cell unit comprising: a layer of a first conductivity type semiconductor material, a surface layer of second conductivity type semiconductor material, overlaid in contact with the layer of the first conductivity type semiconductor material, said surface layer being adapted for exposure to tangentially incident solar radiation, said surface layer having a periodic pattern of alternating first and second regions with the first region having a first complex impedance to a tangentially incident plane wave of solar radiation and the second region having a second complex impedance to the incident plane wave of solar radiation, the complex impedances of the first and second regions being different and causing the generation of a local Hartree-harmonics field whereby the local Hartree-harmonics field interferes with any tangentially incident solar radiation to deflect said tangentially incident radiation towards said surface layer, thereby increasing the effective area of the solar cell for converting solar energy into electricity.

2. The solar cell unit of claim 1, wherein said pattern exhibits equidistant and substantially straight lines.

3. The solar cell unit of claim 1, wherein said pattern exhibits stripes which form arcs, are wavy or form parts of circles.

4. The solar cell unit of claim 1, 2 or 3, wherein the pattern exhibits a double periodic character.

5. The solar cell unit of claim 1, 2 or 3, wherein the pattern is periodic in two mutually orthogonal directions on said surface layer whereby the structure is sensitive to the TM-mode as well as the TE-mode of the solar radiation oscillations.

6. The solar cell unit of claim 5 wherein the pattern is substantially chessboard-like.

7. The solar cell unit of claim 5 wherein the pattern is mutually orthogonal arrays of individually separated spots.

8. The solar cell unit of claim 5 wherein the pattern is mutually orthogonal arrays of individually separated plus signs.

9. The solar cell unit of claims 2, 3 or 1 wherein the pattern is developed by placing regions with different complex impedances in two different levels of the surface layer.

10. A solar cell unit of claim 9 wherein the pattern is provided by means of an etching technique.

11. A solar cell unit of claim 9 wherein said pattern is provided by means of a coating technique.

12. The solar cell unit of claims 2, 3 or 1 wherein the pattern is composed by alternating regions of different material having different indices of refraction.

13. A solar cell unit of claim 12, wherein said structure is provided by means of an embedment technique.

14. A panel comprising a plurality of solar cell units according to claims 2, 3 or 1 wherein the exposed light receiving surfaces of said plurality of solar cell units form parallel, mutually separated planes which are arranged substantially parallel to an ecliptic plane.

15. A solar cell unit of claims 2, 3 or 1 characterized in that the pattern is provided by means of a holographic technique in which the pattern represents a holographic negative image.

16. A solar cell unit according to claims 2, 3 or 1 wherein the pattern is provided on a separate transparent layer which is attached directly to said surface layer.

17. The solar cell unit of claims 2, 3 or 1 wherein the pattern is composed by alternating regions of different materials having different dielectric constants.

18. The solar cell unit of claims 2, 3 or 1 wherein the first complex impedance is finite and the second complex impedance is infinite.

19. A solar unit according to claims 2, 3 or 1 wherein the pattern is provided on a separate transparent layer which is located a short distance from said surface layer.

20. A panel comprising a plurality of solar cell units of claim 1 characterized in that said plurality of such units define parallel planes arranged equidistantly with a mutual separation distance D which is greater than the width B of the individual cell units and so that said planes are substantially parallel with the average position of an ecliptic plane.

21. The solar cell unit of claim 1 wherein said pattern exhibits stripes which are wavy.

22. The solar cell unit of claim 1 wherein said pattern exhibits stripes which form parts of circles.

23. The solar cell unit of claims 2, 3, 1, 21 or 22 wherein the pattern exhibits a multiple periodic character.

* * * * *